(12) United States Patent
Ito et al.

(10) Patent No.: US 8,119,903 B2
(45) Date of Patent: Feb. 21, 2012

(54) METHOD OF MANUFACTURING SINGLE CRYSTAL SILICON SOLAR CELL AND SINGLE CRYSTAL SILICON SOLAR CELL

(75) Inventors: Atsuo Ito, Tokyo (JP); Shoji Akiyama, Gunma (JP); Makoto Kawai, Gunma (JP); Koichi Tanaka, Gunma (JP); Yuuji Tobisaka, Gunma (JP); Yoshihiro Kubota, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 398 days.

(21) Appl. No.: 11/984,182

(22) Filed: Nov. 14, 2007

(65) Prior Publication Data
US 2008/0121278 A1    May 29, 2008

(30) Foreign Application Priority Data

Nov. 24, 2006   (JP) ................................ 2006-317563

(51) Int. Cl.
*H01L 31/04*     (2006.01)
*H01L 31/0216*   (2006.01)
*B05D 5/12*      (2006.01)

(52) U.S. Cl. ........... 136/255; 136/256; 136/261; 427/74
(58) Field of Classification Search .......... 136/243–265; 427/74; *H01L 31/216; B05D 5/12*
See application file for complete search history.

(56) References Cited

U.S. PATENT DOCUMENTS

| | | | |
|---|---|---|---|
| 4,427,839 A | * | 1/1984 | Hall .............................. 136/255 |
| 4,773,942 A | | 9/1988 | Hamakawa et al. |
| 4,927,770 A | | 5/1990 | Swanson |
| 5,374,564 A | | 12/1994 | Bruel |

(Continued)

FOREIGN PATENT DOCUMENTS

DE    199 36 941 A1    5/2000
(Continued)

OTHER PUBLICATIONS

Office Action for U.S. Appl. No. 12/073,437; mailed Nov. 27, 2009.
(Continued)

*Primary Examiner* — Jeffrey T Barton
*Assistant Examiner* — Magali P Slawski
(74) *Attorney, Agent, or Firm* — Oliff & Berridge, PLC

(57) ABSTRACT

There is disclosed a single crystal silicon solar cell includes the steps of: implanting hydrogen ions or rare gas ions to a single crystal silicon substrate; performing surface activation on at least one of an ion-implanted surface of the single crystal silicon substrate and a surface of a transparent insulator substrate; bonding the ion-implanted surface of the single crystal silicon substrate and the transparent insulator substrate with the surface-activated surface being set as a bonding surface; applying an impact onto the ion implanted layer to mechanically delaminate the single crystal silicon substrate to form a single crystal silicon layer; forming a plurality of diffusion regions having a second conductivity type on the delaminated plane side of the single crystal silicon layer; forming a plurality of first conductivity type regions and a plurality of second conductivity type regions on the delaminated plane of the single crystal silicon layer; and forming a light reflection film that covers the plurality of first conductivity type regions and the plurality of second conductivity type regions. There can be provided an optical confinement type single crystal silicon solar cell where a thin-film light conversion layer is made of high-crystallinity single crystal silicon.

18 Claims, 2 Drawing Sheets

U.S. PATENT DOCUMENTS

| | | | |
|---|---|---|---|
| 5,646,432 A | | 7/1997 | Iwaki et al. |
| 5,656,098 A | * | 8/1997 | Ishikawa et al. ............ 136/256 |
| 5,665,607 A | | 9/1997 | Kawama et al. |
| 5,811,348 A | | 9/1998 | Matsushita et al. |
| 5,956,571 A | * | 9/1999 | Yang ........................ 438/69 |
| 5,972,732 A | | 10/1999 | Gee et al. |
| 5,985,742 A | | 11/1999 | Henley et al. |
| 6,013,563 A | | 1/2000 | Henley et al. |
| 6,048,411 A | | 4/2000 | Henley et al. |
| 6,331,208 B1 | | 12/2001 | Nishida et al. |
| 6,391,743 B1 | | 5/2002 | Iwane et al. |
| 6,426,235 B1 | | 7/2002 | Matsushita et al. |
| 6,555,443 B1 | | 4/2003 | Artmann et al. |
| 2002/0011590 A1 | | 1/2002 | Nagashima |
| 2003/0203547 A1 | | 10/2003 | Sakaguchi |
| 2004/0207485 A1 | | 10/2004 | Kawachi et al. |
| 2004/0229444 A1 | | 11/2004 | Couillard et al. |
| 2004/0248379 A1 | | 12/2004 | Maleville et al. |
| 2006/0169316 A1 | | 8/2006 | Thomsen et al. |
| 2008/0099067 A1 | | 5/2008 | Ito et al. |
| 2008/0121275 A1 | | 5/2008 | Ito et al. |
| 2008/0121278 A1 | | 5/2008 | Ito et al. |
| 2009/0007960 A1 | | 1/2009 | Ito et al. |

FOREIGN PATENT DOCUMENTS

| | | |
|---|---|---|
| EP | 0 971 396 A1 | 1/2000 |
| JP | A-63-287077 | 11/1988 |
| JP | A-5-211128 | 8/1993 |
| JP | A-07-106617 | 4/1995 |
| JP | A-7-226528 | 8/1995 |
| JP | 08-213645 | 8/1996 |
| JP | A-9-331077 | 12/1997 |
| JP | A-10-93122 | 4/1998 |
| JP | A-11-004008 | 1/1999 |
| JP | A-2000-150940 | 5/2000 |
| JP | A-2000-164905 | 6/2000 |
| JP | A-2001-111080 | 4/2001 |
| JP | A-2001-189477 | 7/2001 |
| JP | A-2001-217443 | 8/2001 |
| JP | A-2003-017723 | 1/2003 |
| JP | A-2004-304622 | 10/2004 |
| JP | A 2004-342909 | 12/2004 |
| JP | 2006295037 A * | 10/2006 |
| JP | A-2006-295037 | 10/2006 |
| JP | A-2006-324530 | 11/2006 |
| JP | A-2008-112840 | 5/2008 |
| JP | A-2008-112848 | 5/2008 |
| WO | WO 2006/093817 | 9/2006 |

OTHER PUBLICATIONS

Office Action for U.S. Appl. No. 11/976,026; mailed Dec. 24, 2009.
Office Action for U.S. Appl. No. 11/976,020; mailed Jan. 25, 2010.
Partial Translation of a Japanese Notification of Reasons for Refusal issued on Dec. 8, 2009 for Japanese Application No. 2007-56870; 4pgs.
Kiyoshi, Takahashi et al., "Solar Photovoltaic Power Generation," Imprint, pp. 217 and 233, 1980.
Office Action for U.S. Appl. No. 12/073,437; mailed May 12, 2010.
Apr. 13, 2010 Office Action issued in Chinese Application No. 200710193656.X (with partial translation).
Office Action issued in U.S. Appl. No. 11/976,021; mailed Jan. 4, 2010.
Decision of Refusal for Patent Application No. 2006-294608; mailed Feb. 23, 2010 (with translation).
Dec. 15, 2010 Office Action issued in Japanese Patent Application No. 2006317563 (with partial translation).
Dec. 15, 2010 Japanese Notification of Reasons for Refusal issued in JP-2007-056870 (with Translation).
Dec. 21, 2010 Japanese Outline of a Questioning issued in JP-2006-294490 (with Translation).
Dec. 21, 2010 Japanese Outline of a Questioning issued in JP-2006-294605 (with Translation).
Dec. 21, 2010 Japanese Outline of a Questioning issued in JP-2006-294553 (with Translation).
Dec. 21, 2010 Japanese Outline of a Questioning issued in JP-2006-294608 (with Translation).
Jan. 26, 2011 Office Action issued in Chinese Application No. 2007101851256 (with translation).
Mar. 9, 2011 Office Action issued in Chinese Patent Application No. 200710185124.1 (with partial Englishlanguage translation).
Mar. 9, 2011 Office Action issued in Chinese Patent Application No. 200710185123.7 (with partial English-language translation).
Shah et al., "Thin-film Silicon Solar Cell Technology", Progress in Photovoltaics: Research and Applications, 2004, pp. 113-142, vol. 12.
May 13, 2011 Extended European Search Report issued in European Application No. 07022106.4.
May 13, 2011 Extended European Search Report issued in European Application No. 07020917.6.
May 13, 2011 Extended European Search Report issued in European Application No. 07020916.8.
May 13, 2011 Extended European Search Report issued in European Application No. 07020918.4.
May 24, 2011 Notification of Reasons for Refusal issued in Japanese Patent Application No. 2006-294553 with partial translation.
May 24, 2011 Notification of Reasons for Refusal issued in Japanese Patent Application No. 2006-294608 with partial translation.
May 24, 2011 Notification of Reasons for Refusal issued in Japanese Patent Application No. 2006-294490 with partial translation.
May 24, 2011 Notification of Reasons for Refusal issued in Japanese Patent Application No. 2006-294605 with partial translation.
Jul. 12, 2011 Office Action issued in U.S. Appl. No. 11/976,020.
Aug. 23, 2011 Decision on Refusal issued in Japanese Application No. 2006-317563 with English-language translation.
Oct. 28, 2010 Office Action issued in U.S. Appl. No. 12/073,437.
Oct. 25, 2010 Office Action issued in U.S. Appl. No. 12/076,916.
Nov. 14, 2011 Office Action issued in U.S. Appl. No. 11/976,026.
Oct. 19, 2011 Office Action issued in Chinese Application No. 200710193656.X with partial English-language translation.

* cited by examiner (a)

(b)

METHOD OF MANUFACTURING SINGLE CRYSTAL SILICON SOLAR CELL AND SINGLE CRYSTAL SILICON SOLAR CELL

BACKGROUND OF THE INVENTION

1. Field of the Invention

The present invention relates to a method for manufacturing a single crystal silicon solar cell and a single crystal silicon solar cell.

2. Description of the Related Art

Solar batteries mainly containing silicon are classified a single crystal silicon solar cell, a polycrystalline silicon solar cell, and an amorphous silicon solar cell, depending on crystallinity. Among those, the single crystal silicon solar cell is prepared as follows: single crystal ingot based on crystal pulling is sliced into a wafer with a wire saw, the wafer is processed into a thickness of 100 to 200 µm, and a pn junction, an electrode, a protective film, and the like are formed thereon to complete a solar cell.

As for polycrystalline silicon, molten metal silicon is crystallized through molding, not crystal pulling, to manufacture polycrystalline ingot. The ingot is sliced into a wafer with a wire saw similar to the single crystal silicon solar cell. The wafer is similarly processed into the thickness of 100 to 200 µm. A pn junction, an electrode, and a protective film are formed similar to the cell single crystal silicon substrate to complete a solar cell.

As for amorphous silicon solar cell, for example, a silane gas is decomposed in a gas phase through discharging by a plasma CVD method to form an amorphous silicon hydride film on the substrate, and diborane, phosphine, and the like are applied as a doping gas and deposited at the same time to concurrently perform a step of forming a pn junction and a film formation step, and an electrode and a protective film are formed to complete a solar cell. In the amorphous silicon solar cell, amorphous silicon absorbs incident light as a direct transition type, so its optical absorption coefficient is about one digit higher than that of the single crystal and polycrystalline silicon ("Solar photovoltaic power generation", p. 233, by Kiyoshi Takahashi, Yoshihiro Hamakawa, and Akio Ushirokawa, Morikita Shuppan, 1980). Thus, the amorphous silicon has an advantage that a requisite thickness of the amorphous silicon layer is only about 1 µm that is about 1/100 of that of the crystalline solar cell. In consideration of the fact that the production of solar batteries per year exceeds 1 gigawatt in recent years, and will be increased in future, a thin-film amorphous silicon solar cell that enables efficient utilization of resources is very promising.

However, a rate of utilization of the resources cannot be determined simply through comparison with a film thickness necessary for a crystalline solar cell if considering that high-purity gas materials such as silane or diborane are used for manufacturing an amorphous silicon solar cell and that a rate of utilization of the gas materials includes that of the material deposited on portions other than the substrate in a plasma CVD device. In addition, a conversion efficiency of the crystalline solar cell is about 15%, while that of the amorphous silicon solar cell is about 10%. In addition, a problem about degradation in output characteristics due to irradiation with light remains to be solved.

To that end, many attempts to develop a thin-film solar cell with a crystalline silicon material have been made ("Solar photovoltaic power generation", p. 217, by Kiyoshi Takahashi, Yoshihiro Hamakawa, and Akio Ushirokawa, Morikita Shuppan, 1980). For example, a polycrystalline thin film is formed on an alumina substrate or graphite substrate with a trichlorosilane gas or a tetrachlorosilane gas. The thus-formed film involves many crystal defects, and its conversion efficiency is low. To improve the conversion efficiency, zone melting should be performed to improve crystallinity (see Japanese Unexamined Patent Application Publication No. 2004-342909, for instance). However, even though the zone melting is carried out, there remains a problem of lowering photocurrent response characteristics within a long wavelength band due to reduction in lifetime and a leak current in the crystal grain boundary.

SUMMARY OF THE INVENTION

The present invention has been accomplished in view of the above problems, and it is an object to the present invention to realize efficient utilization of silicon as a material for a silicon solar cell, and to provide a thin-film single crystal silicon solar cell having high conversion efficiency and less degrading due to irradiation with light as a solar cell having an optical confinement type structure, an efficiency of which is increased as much as possible with respect to a film thickness and provide a method for manufacturing the same.

To attain the above object, the present invention provides a method for manufacturing a single crystal silicon solar cell including at least a light reflection film, a single crystal silicon layer as a light conversion layer, and a transparent insulator substrate, which are laminated on one another with a surface on the transparent insulator substrate side used as a light receiving surface, including at least the steps of: preparing the transparent insulator substrate and the single crystal silicon substrate having a first conductivity type; implanting at least one of hydrogen ions and rare gas ions to the single crystal silicon substrate to form an ion implanted layer; performing surface activation on at least one of an ion-implanted surface of the single crystal silicon substrate and one surface of the transparent insulator substrate; bonding the ion-implanted surface of the single crystal silicon substrate and the transparent insulator substrate with the surface-activated surface being set as a bonding surface; applying an impact onto the ion implanted layer to mechanically delaminate the single crystal silicon substrate to form the single crystal silicon layer; forming a plurality of diffusion regions having a second conductivity type different from the first conductivity type on the delaminated plane side of the single crystal silicon layer, and forming a plurality of pn junctions at least in a planar direction and forming a plurality of first conductivity type regions and a plurality of second conductivity type regions on the delaminated plane of the single crystal silicon layer; forming a plurality of first individual electrodes on the plurality of first conductivity type regions of the single crystal silicon layer, and forming a plurality of second individual electrodes on the plurality of second conductivity type regions of the single crystal silicon layer; forming first collecting electrodes connecting the plurality of first individual electrodes and second collecting electrodes connecting the plurality of second individual electrodes; and forming a light reflection film that covers the plurality of first conductivity type regions and the plurality of second conductivity type regions.

According to the method for manufacturing a single crystal silicon solar cell including the above steps, it is possible to manufacture a thin-film single crystal silicon solar cell having an optical confinement type structure, in which a thin-film single crystal silicon layer is formed as a light conversion layer, and a light reflection film is formed on a surface opposite to the light receiving surface. The thin-film single crystal silicon solar cell is a solar cell where a light conversion layer is the single crystal silicon layer, so the solar cell having a high conversion efficiency with respect to a film thickness and less degrading due to irradiation with light can be provided.

Further, according to the method for manufacturing a single crystal silicon solar cell including the above steps, the single crystal silicon layer as a light conversion layer is formed by being delaminated from the single crystal silicon substrate, so crystallinity of the single crystal silicon layer can be increased. As a result, conversion efficiency of the solar cell can be further increased.

Further, the single crystal silicon substrate and the transparent insulator substrate are bonded after the surface activation and thus can be firmly bonded. Hence, a bonding strength is increased without high-temperature heat treatment for increasing adhesion. Further, since the bonding surfaces are closely bonded as described above, it is possible to apply a shock onto the ion implanted layer in a subsequent step to mechanically delaminate the single crystal silicon substrate, and to form a thin single crystal silicon layer on the transparent insulator substrate. Therefore, a single crystal silicon layer can be formed as a thin film without performing heat treatment for delamination.

Further, the single crystal silicon substrate is delaminated for forming the single crystal silicon layer through mechanical delamination, not heating, so cracks or defects can be prevented from developing in light conversion layer due to a thermal expansion coefficient difference.

In addition, it is possible to save a silicon material and realize efficient utilization thereof because a thin silicon layer is used for the thin-film solar cell.

In addition, since electrodes are not formed on the light receiving surface side, optical absorptance of the single crystal silicon layer as the light conversion layer can be further increased. As a result, a conversion efficiency of the solar cell can be increased.

In this case, the surface activation is preferably performed through at least one of a plasma treatment and an ozone treatment.

As described above, if the surface activation is performed through at least one of a plasma treatment and an ozone treatment, the surface activation can be easily executed, and the single crystal silicon substrate and the transparent insulator substrate can be firmly bonded.

Further, the transparent insulator substrate is preferably selected from the group consisting of quartz glass, crystallized glass, borosilicate glass, and soda-lime glass.

As described above, if the transparent insulator substrate is quartz glass, crystallized glass, borosilicate glass, or soda-lime glass, each of these substrates is a transparent insulator substrate having high optical characteristics, and an optical confinement type thin-film single crystal silicon solar cell that transmits light on the light receiving surface side can be easily manufactured.

Further, an inner portion of the transparent insulator substrate or a surface of the transparent insulator substrate opposite to the surface to be bonded to the single crystal silicon substrate previously has light scattering property.

As described above, if an inner portion of the transparent insulator substrate opposite or a surface of the transparent insulator substrate opposite to the surface to be bonded to the single crystal silicon substrate has light scattering property, an optical length of light incident on the single crystal silicon layer as a light conversion layer can be further increased, and a thin-film single crystal silicon solar cell having an optical confinement type structure which can make the single crystal silicon layer as the light conversion layer to absorb much light can be manufactured. As a result, a conversion efficiency can be further improved.

Further, a depth of the ion implantation is preferably set to 2 µm or more and 50 µm or less from the ion-implanted surface.

As described above, if a depth of the ion implantation is set to 2 µm or more and 50 µm or less from the ion-implanted surface, a thickness of the single crystal silicon layer as a light conversion layer in the manufactured single crystal silicon solar cell can be set approximately 2 µm or more and 50 µm or less. If the single crystal silicon solar cell includes such a thin-film single crystal silicon layer, a practical conversion efficiency of the thin-film single crystal silicon solar cell is attained and in addition, a requisite amount of silicon material can be reduced.

Further, the present invention provides a single crystal silicon solar cell manufactured by the method for manufacturing a single crystal silicon solar cell according to any one of the above aspects.

As described above, if a single crystal silicon solar cell is manufactured by the method for manufacturing a single crystal silicon solar cell according to any one of the above aspects, a single crystal silicon layer as a light conversion layer is formed by being delaminated from the single crystal silicon substrate, and the single crystal silicon layer is delaminated through mechanical delamination, not heating, so a high-crystallinity single crystal silicon layer can be formed. Hence, a thin-film solar cell having high conversion efficiency with respect to the film thickness is obtained.

Further, the present invention provides a single crystal silicon solar cell, wherein at least a light reflection film, a single crystal silicon layer, and a transparent insulator substrate are laminated on one another, a plurality of first conductivity type regions and a plurality of second conductivity type regions are formed on a surface of the single crystal silicon layer on the light reflection film side, a plurality of pn junctions are formed at least in a planar direction, a plurality of first individual electrodes is formed on the plurality of first conductivity type regions of the single crystal silicon layer, a plurality of second individual electrodes are formed on the plurality of second conductivity type regions, and first collecting electrodes connecting the plurality of first individual electrodes and second collecting electrodes connecting the plurality of second individual electrodes are formed.

The single crystal silicon solar cell having the above structure is a thin-film single crystal silicon solar cell having an optical confinement type structure where a thin-film single crystal silicon layer is formed as a light conversion layer, and a light reflection film is formed on a surface opposite to the light receiving surface. The thin-film single crystal silicon solar cell is a solar cell where the light conversion layer is a single crystal silicon layer, so a solar cell having high conversion efficiency and less degrading due to irradiation with light as a solar cell can be provided.

Further, since electrodes are not formed on the light receiving surface side, optical absorptance of the single crystal silicon layer as the light conversion layer can be further increased. As a result, a conversion efficiency of the solar cell can be increased.

In this case, the transparent insulator substrate is preferably selected from the group consisting of quartz glass, crystallized glass, borosilicate glass, and soda-lime glass.

As described above, if the transparent insulator substrate is preferably selected from the group consisting of quartz glass, crystallized glass, borosilicate glass, and soda-lime glass, each of these substrates is a transparent insulator substrate having high optical characteristics, so the light receiving surface side can transmit much light, and the single crystal silicon layer as a light conversion layer can absorb much light.

Further, an inner portion of the transparent insulator substrate or a surface of the transparent insulator substrate opposite to the single crystal silicon substrate may have light scattering property.

As described above, if an inner portion of the transparent insulator substrate or a surface of the transparent insulator substrate opposite to the single crystal silicon substrate may have light scattering property, an optical length of light incident on the single crystal silicon layer as a light conversion layer can be further increased, and an optical confinement type thin-film single crystal silicon solar cell that transmits light on the light receiving surface side can be easily manufactured. As a result, a conversion efficiency can be further increased.

Further, the single crystal silicon layer preferably has a film thickness of 2 µm or more and 50 µm or less.

As described above, if the single crystal silicon layer preferably has a film thickness of 2 µm or more and 50 µm or less, a practical conversion efficiency of the thin-film single crystal silicon solar cell is attained and in addition, a requisite amount of silicon material can be reduced.

According to the method for manufacturing a single crystal silicon solar cell of the present invention, it is possible to manufacture an optical confinement type thin-film solar cell including a single crystal silicon layer having high crystallinity and conversion efficiency as a light conversion layer.

Further, the single crystal silicon solar cell according to the present invention is an optical confinement type solar cell including a single crystal silicon layer as a light conversion layer, so a solar cell having high conversion efficiency with respect to the film thickness can be obtained.

DETAILED DESCRIPTION OF THE PREFERRED EMBODIMENTS

As described above, a higher conversion efficiency has been required of the thin-film solar cell that can saves an amount of silicon material, so there is a demand for increasing crystallinity of a crystalline solar cell.

To that end, the present inventors have made extensive studies to overcome the above problem and finally found that if the single crystal silicon substrate and the transparent insulator substrate are bonded and then, the single crystal silicon substrate is formed into a thin film, crystallinity of a silicon layer as a light conversion layer is increased. Further, the inventors have conceived that if surfaces of the single crystal silicon substrate and the transparent insulator substrate are activated before they are bonded, a bonding strength can be increased without high-temperature heat treatment, and if mechanical delamination is performed upon delamination, high-temperature heat treatment is not performed, so crystallinity of the single crystal silicon layer can be kept high. Further, in the case of using such a thin-film single crystal silicon layer as a light conversion layer, pn junction interfaces may not be formed in parallel to a light receiving surface but may be formed in a direction vertical to the light receiving surface to generate photoelectromotive force. The inventors have conceived that if the solar cell has such a structure, it is unnecessary to form electrodes on the light receiving surface side, and the light conversion layer can absorb much light, and accomplished the present invention.

Hereinafter, embodiments of the present invention will be described in detail, but the present invention is not limited to these embodiments.

Figure 1:
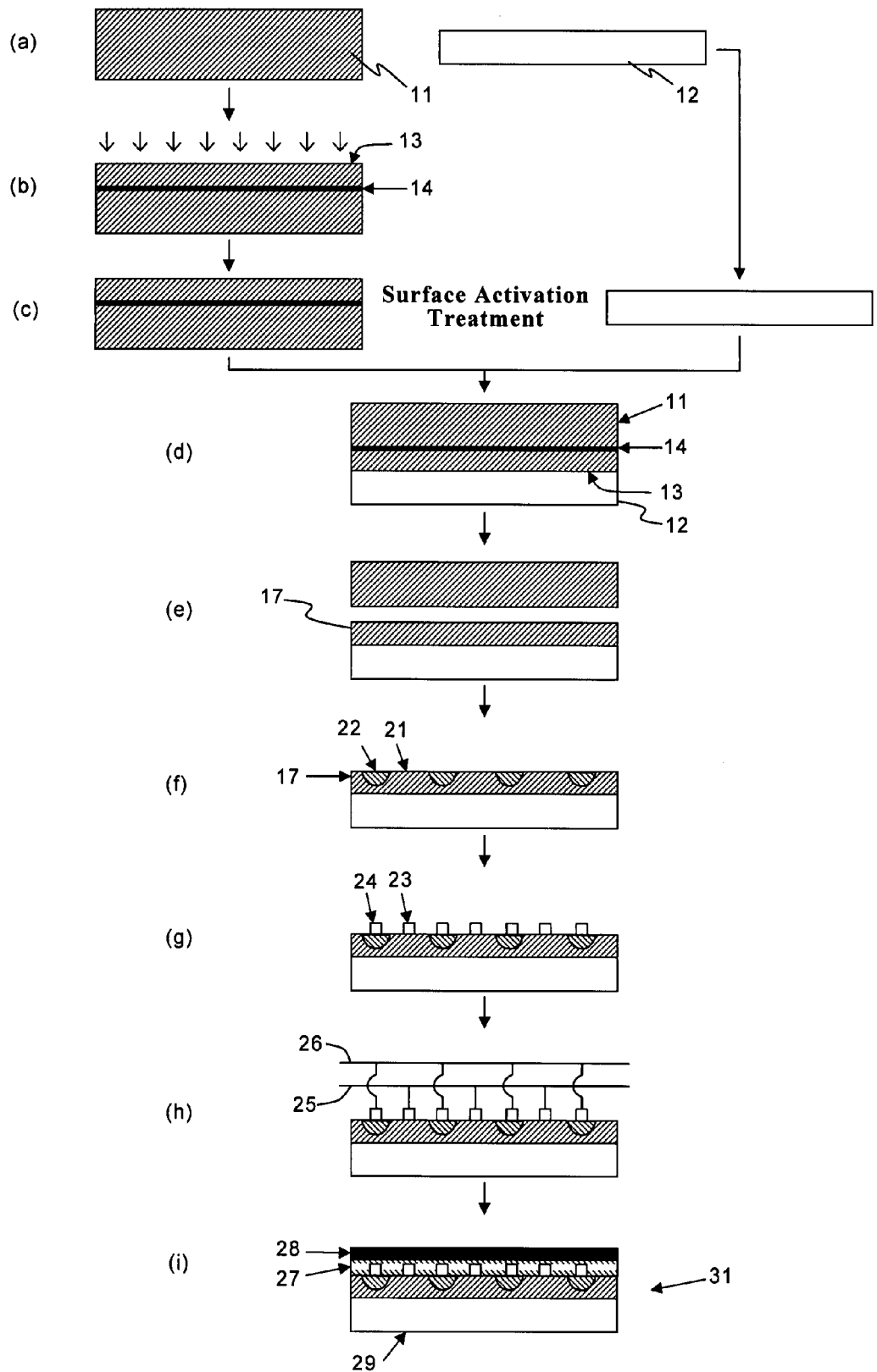
FIG. 1 is a process chart showing an example of a method for manufacturing a single crystal silicon solar cell according to the present invention.

FIG. 1 is a process chart of an example of a method for manufacturing a single crystal silicon solar cell according to the present invention.

First, a single crystal silicon substrate 11 and a transparent insulator substrate 12 are prepared (step (a)).

There is no particular limitation on the single crystal silicon substrate. For example, a substrate fabricated by slicing single crystal that grows based on a Czochralski process and having the diameter of 100 to 300 mm, a p or n conductivity type, and a resistivity of about 0.1 to 20 Ω·cm can be used, for example. Its thickness is not particularly limited but may be, for example, about 10 to 1000 µm.

Further, quartz glass, crystallized glass, borosilicate glass, soda-lime glass, or the like is selected as the transparent insulator substrate. Although the substrate is not limited thereto, a material having high transparency with respect to light absorbed to single crystal silicon is desirable. Beside, clear glass or hardened glass may be used. If the transparent insulator substrate is made of a general-purpose glass material, soda-lime glass, silicon oxide coating or tin oxide coating (nesa film) may be formed on its surface by dip coating. The above coating preferably functions as a buffer film to prevent elution or diffusion of alkali metal components in the soda-lime glass to the surface.

Incidentally, it is desirable that bonding surfaces of the single crystal silicon substrate 11 and the transparent insulator substrate 12 be well flattened in order to increase strength of bonding therebetween in a bonding step of the following step (d). Such high-flatness surfaces can be obtained by flattening the surfaces through polishing or the like.

Next, at least one of hydrogen ions and rare gas ions are implanted to the single crystal silicon substrate 11 to form an ion implanted layer 14 (step (b)).

For example, process temperature of the single crystal silicon substrate is set to 200 to 450° C., and at least one of hydrogen ions and rare gas ions are implanted with a predetermined dosage at an implantation energy high enough to form the ion implanted layer 14 at a desired depth from the surface 13 corresponding to the thickness of the single crystal silicon layer, for example, 2 µm or more and 50 µm or less. In this case, if ions are implanted with the same acceleration energy, hydrogen ions are light in weight and thus can be implanted to a deep portion from the ion-implanted surface 13. Thus, hydrogen ions are preferred. The hydrogen ions may be negative or positive ions, and hydrogen gas ions as well as atomic ions may be used. In the case of using rare gas ions as well, the ions may be positive or negative ions.

Further, if an insulator film such as a thin silicon oxide film is previously formed on the surface of the single crystal silicon substrate, and ions are implanted through the film, an effect of suppressing channeling of implanted ions can be obtained.

Next, at least one of the ion-implanted surface 13 of the single crystal silicon substrate 11 and one surface of the transparent insulator substrate 12 is subjected to surface activation (step (c)).

This surface activation aims at firmly bonding the single crystal silicon substrate 11 and the transparent insulator substrate 12 in the next step (d), and at activating a bonding surface (the ion-implanted surface 13 of the single crystal silicon substrate 11). Although the surface activation method is not particularly limited, the activation can be appropriately performed through at least one of a plasma treatment and an ozone treatment.

In the case of performing the surface treatment through a plasma treatment, the single crystal silicon substrate 11 and/or the transparent insulator substrate 12 cleaned by RCA cleaning is placed in a vacuum chamber, and a plasma gas is introduced to the vacuum chamber. Then, the substrate is exposed to RF plasma having a power of about 100 W for about 5 to 10 seconds, and the treatment is completed to perform a plasma treatment on at least a surface of the substrate to be bonded in the step (d), that is, ion-implanted surface 13 of the single crystal silicon substrate 11 or one main surface of the transparent insulator substrate 12. There is no particular limitation on the plasma gas. To treat the single crystal silicon substrate, an oxygen gas plasma may be used in the case of oxidizing the surface; otherwise, a hydrogen gas, an argon gas, and a mixed gas thereof, or a mixed gas of a hydrogen gas and a helium gas may be used. Any gas can be used for treating the transparent insulator substrate.

In the case of performing the surface treatment through an ozone treatment, the single crystal silicon substrate 11 and/or the transparent insulator substrate 12 cleaned by RCA cleaning is placed in a chamber where an atmosphere is introduced, and plasma gas such as a nitrogen gas or an argon gas is introduced into the chamber, after which an RF plasma is generated, and the oxygen in the atmosphere is turned into an ozone to perform an ozone treatment on at least the surface to be activated. One or both of the plasma treatment and the ozone treatment may be performed.

As a result of the surface activation such as the plasma treatment or ozone treatment, an organic material on the surface of the single crystal silicon substrate 11 and/or the transparent insulator substrate 12 is oxidized and removed, the number of OH groups on the surface increases, and the surface is activated. It is preferred to perform the surface activation on both of the surfaces of the single crystal silicon substrate 11 and the surface of the transparent insulator substrate 12, but the surface activation may be performed on either surface.

Next, the ion-implanted surface 13 of the single crystal silicon substrate 11 and the surface of the transparent insulator substrate 12 are bonded with the surface activated in the above step (c) being set as a bonding surface (step (d)).

In step (c), at least one of the ion-implanted surface 13 of the single crystal silicon substrate and the surface of the transparent insulator substrate 12 is subjected to surface activation, so these substrates can be firmly bonded with a strength enough to withstand mechanical delamination in a subsequent step only by bring these substrates into close contact with each other under a reduced pressure or atmospheric pressure within a temperature range of room temperatures to about 250° C., preferably, at approximately room temperatures.

This bonding step is carried out within a temperature range of room temperatures to around 250° C., and heat treatment is not performed at 300° C. or higher. This is because, if high-temperature heat treatment is not performed at 300° C. or higher on the single crystal silicon substrate 11 and transparent insulator substrate 12 that are bonded together, thermal strain, cracking, or delamination might occur due to a thermal expansion coefficient difference between the layers. Likewise, the high-temperature heat treatment should not be performed at 300° C. or higher until the completion of delamination/transference of the single crystal silicon substrate 11 in a subsequent step (e).

Next, a shock is applied onto the ion implanted layer 14 to mechanically delaminate the single crystal silicon substrate 11 to form the single crystal silicon layer 17 (step (e)).

According to the present invention, a shock is applied onto the ion implanted layer for mechanical delamination, so there is no fear that thermal strain, cracking, and delamination occur under heating. To apply a shock to the ion implanted layer, for example, a jet of fluids such as gas or liquid may be continuously or intermittently applied from a side surface of the bonded wafer, but any other method that applies a shock for mechanical delamination can be employed with no particular limitation.

Incidentally, at the time of mechanically delaminating the single crystal silicon substrate, it is desirable to closely bond a first auxiliary substrate to a rear side of the transparent insulator substrate and closely bond a second auxiliary substrate to a rear side of the single crystal silicon substrate, and delaminate the single crystal silicon substrate. If mechanical delamination is carried out with the auxiliary substrate in this way, it is possible to prevent microcracks that develop due to warping and the generation of crystal defects due to the microcracks in the delaminated and transferred silicon single crystal layer 17, and to prevent reduction in conversion efficiency of the solar cell. If the two substrates are as thin as about 1 mm, this method is very effective. For example, if the transparent insulator substrate is soda-lime glass with the thickness of 0.7 mm, the auxiliary substrate is also made of soda-lime glassy and the total thickness of the two substrates is set to 1 mm or more. Under these conditions, delamination is performed.

Further, after the single crystal silicon substrate is delaminated and transferred, heat treatment may be performed for recovery from ion-implantation damage near the surface of the single crystal silicon layer 17. At this point, the single crystal silicon substrate 11 has been already delaminated and transferred, and the single crystal silicon layer 17 is a thin film. Thus, even if heat treatment is locally performed near the surface at 300° C. or more, almost no cracks or defects occur. Further, the same applies to subsequent steps.

Next, a plurality of diffusion regions 22 having a second conductivity type different from a first conductivity type of the single crystal silicon substrate prepared in the step (a) are formed on the delaminated plane side of the single crystal silicon layer 17. At this time, a plurality of pn junctions are formed at least in a planar direction (including at least components where the normal to the pn junction interface extends in the planar direction of the single crystal silicon layer 17), and a plurality of first conductivity type regions 21 and a plurality of second conductivity type regions 22 are formed in the delaminated plane of the single crystal silicon layer 17 (step (f)).

If the single crystal silicon substrate 11 prepared in step (a) is p-type single crystal silicon, the first conductivity type is p type, and diffusion regions having an n-type conductivity as a second conductivity type are formed. On the other hand, if the single crystal silicon substrate is n-type single crystal silicon, a first conductivity type is an n type, and diffusion regions having a p-type conductivity as a second conductivity type are formed. More specifically, a plurality of second conductivity type diffusion regions may be formed as follows. That is, if the single crystal silicon substrate 11 prepared in step (a) is a p-type one, phosphorous ions are implanted through ion implantation to a plurality of regions (for example, a plurality of parallel regions) on the surface of the single crystal silicon layer 17, and flash lamp annealing, irradiation with UV that is highly absorbed to the single crystal silicon layer surface or deep UV laser, or the like is carried out to activate donors to thereby form a plurality of pn junctions. At this time, it is desirable to appropriately adjust an ion dosage, diffusion time, and diffusion temperature to prevent a plurality of n-type diffusion regions from overlapping with each other into one single region. Further, a plurality of pn junctions may be formed by preparing a composition paste containing phosphorus for a donor, applying the paste to a plurality of regions (for example, a plurality of parallel regions) of the single crystal silicon layer 17 surface by screen printing or the like, and performing diffusion and activation through flash lamp annealing or irradiation with UV that is highly absorbed to the single crystal silicon layer surface, deep UV laser, or heating in an infrared oven.

Incidentally, the second conductivity type regions 22 may be formed up to a junction interface between the single crystal silicon layer 17 and the transparent insulator substrate 12.

Further, while a plurality of second conductivity type diffusion regions are formed, high concentration diffusion regions of a first conductivity type may be formed between the plurality of second conductivity type diffusion regions. For example, in the case of diffusing phosphorus or the like to a plurality of regions of the p-type silicon substrate to form n-type diffusion regions, an element for forming an acceptor such as boron may be diffused and activated in a similar manner between the plurality of n-type diffusion regions to form a plurality of p$^+$ regions.

Next, a plurality of first individual electrodes 23 are formed on the plurality of first conductivity type regions 21 of the single crystal silicon layer 17, and a plurality of second individual electrodes 24 are formed on the plurality of second conductivity type regions 22 (step (g)).

For example, a plurality of first individual electrodes 23 are formed on the plurality of first conductivity type regions 21 and a plurality of second individual electrodes 24 are formed on the plurality of second conductivity type regions 22 by depositing metal or transparent conductive materials on the surface of the single crystal silicon layer 17 by vacuum evaporation or sputtering. Further, a metal-contained paste-like composition for forming individual electrodes may be applied to the predetermined region by a printing method or the like and cured through heat treatment. Various known methods can be used.

Incidentally, in this case, the first individual electrodes 23 are not in contact with the second conductivity type regions 22, and the second individual electrodes 24 are not in contact with the first conductivity type regions 21.

Incidentally, the step (f) of forming diffusion regions and the step (g) of forming individual electrodes may be performed at the same time as follows. That is, a composition for forming an electrode containing a dopant material as a donor or acceptor may be applied to a predetermined region by a printing method or inkjet method, followed by heat treatment to cure a plurality of electrodes and diffuse dopants. In this case as well, the heat treatment may be carried out through flash lamp annealing, irradiation with UV that is highly absorbed to the single crystal silicon layer surface, or deep UV laser, or heating in an infrared oven.

An interval of application of the composition for forming individual electrodes may be set to 10 μm or more, or 100 μm or more. The single crystal silicon layer 17 according to the present invention has no crystal boundary, and a mobility and lifetime of photogenerated carriers are equivalent to those of a general single crystal silicon substrate, so an interval of the composition for forming individual electrodes can be increased more than intervals of the polycrystalline silicon thin film and amorphous silicon thin film.

Next, first collecting electrodes 25 connecting the plurality of first individual electrodes 23 and second collecting electrodes 26 connecting the plurality of second individual electrodes 24 are formed (step (h)).

A connection mode is not particularly limited in this case, but it is necessary to prevent the first collecting electrodes 25 from contacting the second conductivity type regions 22 or the second individual electrodes 24 and prevent the second collecting electrodes 26 from contacting the first conductivity type regions 21 or the first individual electrodes 23.

The first collecting electrodes 25 and the second collecting electrodes 26 are formed in this way, making it possible to efficiently extract electrons and holes captured by the plurality of first individual electrodes 23 and the plurality of second individual electrodes 24.

Next, a light reflection film 28 for covering the plurality of first conductivity type regions 21 and the plurality of second conductivity type regions 22 is formed (step (i)).

The light reflection film 28 is formed not to short-circuit the first individual electrodes 23 and the first collecting electrodes 25 and short-circuit the second individual electrodes 24 and the second collecting electrodes 26. If the light reflection film is made of metal such as aluminum, a transparent sealing layer 27 made of silicon oxide or silicon nitride is formed to bury various electrodes formed on the single crystal silicon layer 17, and a metal film is formed as the light reflection film 28 in the sealing layer 27. If the light reflection film is formed of an insulator material, the light reflection film 28 may be formed to bury various electrodes formed on the single crystal silicon layer 17. Incidentally, in FIG. 1(i), the first collecting electrodes 25 and the second collecting electrodes 26 are omitted.

Incidentally, it is preferable to use, as the light reflection film 28, a film having a reflectivity of about 80% or more to visible light.

Further, there is no particular limitation on a method of forming the sealing layer 27 or the light reflection film 28. For example, the light reflection film 28 may be formed in such a manner that the sealing layer 27 is formed by, for example, a deposition method such as sputtering, and then a metal film is formed on the sealing layer 27 by evaporation or a metal film is bonded thereon.

Then, the single crystal silicon solar cell accomplished through the steps (a) to (i) is the thin-film single crystal silicon solar cell 31 including a thin single crystal silicon layer, which involves no thermal strain, delamination, cracking, or the like, realizes highly uniform thickness, and has high crystallinity. Incidentally, a light receiving surface 29 is positioned on the transparent insulator substrate 12 side.

As described above, light is incident on the transparent insulator substrate 12 side. To describe one measure for improving a conversion efficiency of the solar cell, light scattering is induced on the light incidence side. According to the present invention, as described above, it is desirable to flatten the surface as much as possible, which is bonded to the single crystal silicon substrate 11 in step (d), out of the main surfaces of the transparent insulator substrate 12. Thus, it is not desirable to make this surface rough to impart light scattering property. Therefore, light scattering property is desirably imparted to the surface opposite to the surface to be bonded to the single crystal silicon substrate 11 in step (d), or to an inner portion of the transparent insulator substrate 12.

For example, the light scattering property may be imparted as follows.

That is, the surface of the transparent insulator substrate 12 opposite to the surface to be bonded to the single crystal silicon substrate 11 in step (d) is made rough with irregularities of, for example, about 1 μm. There is no particular limitation on a method of forming the rough surface, nor on a formation stage of the rough surface. For example, at a stage of preparing the transparent insulator substrate 12 in step (a), the substrate with one surface being rough and the other surface being polished as above may be prepared. Alternatively, the rough surface may be formed in each of the steps (a) to (i).

Besides, a transparent material layer containing transparent microparticles having a size of about 0.1 μm and different refractive indexes is formed on the transparent insulator substrate 12, for example, and used as a light scattering layer.

In addition, the transparent insulator substrate 12 including micro regions having a size of about 0.1 μm and different refractive indexes is used and thus imparted with a light scattering property.

Further, the single crystal silicon substrate from which the single crystal silicon layer 17 is delaminated and transferred in step (e), is subjected to a process for polishing a rough surface after delamination and the ion implanted layer to smooth and remove the surface and the layer and then repeatedly subjected to an ion implantation process, and is thus used as the single crystal silicon substrate 11 again. According to a method for manufacturing a single crystal silicon solar cell of the present invention, the single crystal silicon substrate has not to be heated at 300° C. or more from the ion implantation step to the delamination step, so there is no fear of oxygen-induced defects being generated in the single crystal silicon substrate. Thus, if the single crystal silicon substrate having the thickness of around 1 mm is prepared first, the delamination and transference process can be performed 100 times or more on condition that the single crystal silicon layer 17 has a film thickness of 5 μm, and 10 times or more on condition that the single crystal silicon layer 17 has a film thickness of 50 μm.

FIG. 2(a) schematically shows the configuration of the single crystal silicon solar cell 31 manufactured by the above manufacturing method, and FIG. 2(b) schematically shows a pattern of connecting electrodes. As shown in FIG. 2(b), the light reflection film 28, the single crystal silicon layer 17, and the transparent insulator substrate 12 are layered. The plurality of first conductivity type regions 21 and the plurality of second conductivity type regions 22 are formed on the surface of the single crystal silicon layer 17 on the light reflection film 28 side (delaminated plane), and a plurality of pn junctions are formed at least in a planar direction (including at least components where the normal to the pn junction interface is directed to a planar direction of the single crystal silicon layer 17). The plurality of first individual electrodes 23 are formed on the plurality of first conductivity type regions 21 of the single crystal silicon layer 17, the plurality of second individual electrodes 24 are formed on the plurality of second conductivity type regions 22, and first collecting electrodes 25 connecting the plurality of first individual electrodes 23 and the second collecting electrodes 26 connecting the plurality of second individual electrodes 24 are formed.

Figure 2:
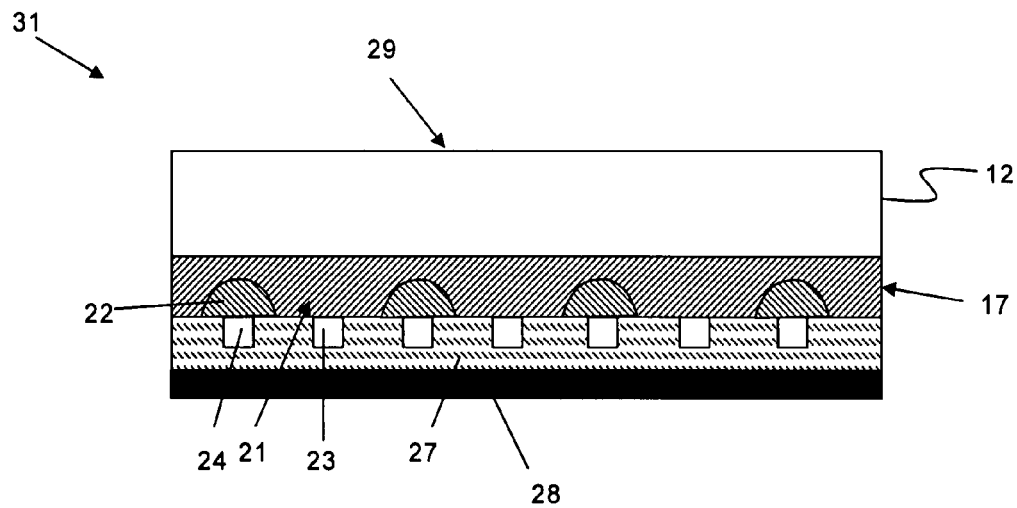
FIG. 2 are schematic sectional views showing an example of a single crystal silicon solar cell according to the present invention, in which (a) is a schematic sectional view where each collecting electrode is omitted and (b) is a schematic sectional view showing how to connect collecting electrodes.
Figure 2:
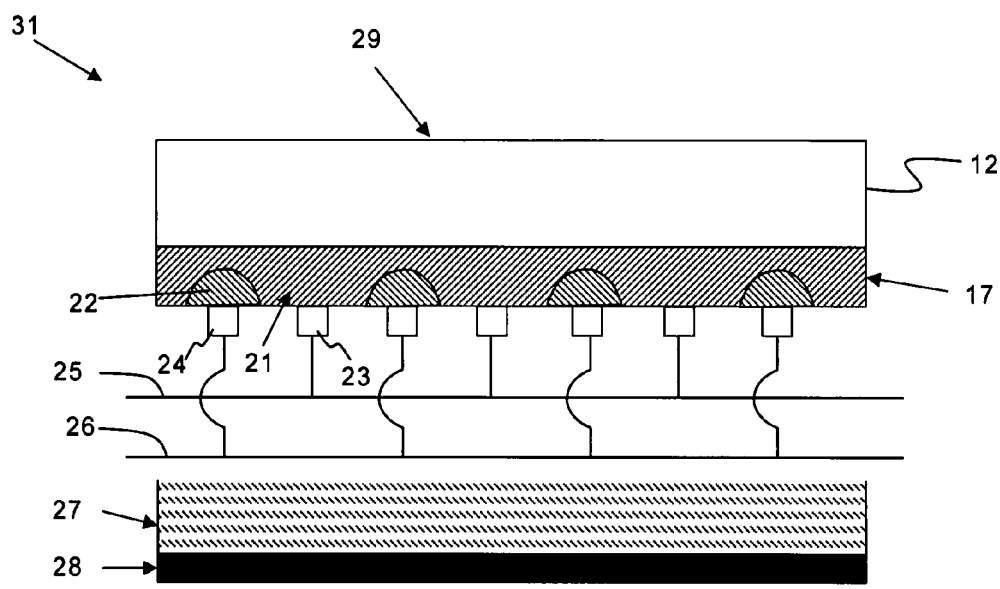

Incidentally, the light receiving surface 29 is an upper surface in FIG. 2 in contradiction to the example of FIG. 1 (i).

Further, the sealing layer 27 made of silicon oxide or silicon nitride may be formed to bury various electrodes.

If the single crystal silicon solar cell including the single crystal silicon layer 17 with a thickness of 2 μm or more and 50 μm is manufactured by the above method, the thin-film single crystal silicon solar cell attains a practical efficiency and can reduce a requisite amount of silicon materials.

Further, the single crystal silicon solar cell 31 has the light reflection film 28 opposite to the light receiving surface 29. Thus, even if light incident from the light receiving surface 29 side is not absorbed but transmitted through the single crystal silicon layer 17, the light can pass through the single crystal silicon layer 17 again with the light reflection film 28, and the total optical absorptance can be increased. In order to improve a conversion efficiency of a thin-film single crystal silicon solar cell that uses a single crystal silicon layer having much lower optical absorptance than amorphous silicon as the light conversion layer and is very thin, a so-called optical confinement type structure of the rear reflection film is effective.

Further, if light scattering property is imparted to an inner portion of the transparent insulator substrate 12 or the surface opposite to the single crystal silicon substrate 17 (light receiving surface 29) by the above method, the following optical confinement type structure is attained: light is scattered to further increase an optical path of light incident on the single crystal silicon layer 17, and the single crystal silicon layer 17 can absorb much light. As a result, a conversion efficiency of the solar cell can be improved.

EXAMPLE 1

As the single crystal silicon substrate 11, a single crystal silicon substrate having the diameter of 200 mm (8 inches), the orientation to (100) plane, a p-type conductivity, and a resistivity of 15 Ω·cm was prepared. Further, as the transparent insulator substrate 12, a quartz glass substrate having the diameter of 200 mm (8 inches) and the thickness of 2.5 mm was prepared (step (a)). Incidentally, each one surface of the two substrates was polished by chemical mechanical polishing (CMP) into a mirror surface, an average surface roughness of which is 0.3 nm or less upon scanning a 10 μm×10 μm area with an atomic force microscope (AFM).

Next, the surface of the single crystal silicon substrate 11 subjected to the above polishing was implanted with hydrogen positive ions with a dosage of $1.0 \times 10^{17}/cm^2$ at an acceleration voltage of 350 keV (step (b)). The depth of the ion implanted layer 14 was approximately 3 μm from the ion-implanted surface 13.

Next, the ion-implanted surface 13 of the single crystal silicon substrate 11 and the polished surface of the quartz glass substrate 12 were exposed to nitrogen plasma for 15 seconds by low-pressure plasma spraying for surface activation (step (c)).

Next, the surface-activated surfaces were set as bonding surfaces, and the single crystal silicon 11 and the quartz glass substrate 12 are firmly bonded (step (d)). After the bonding, the bonded substrate was subjected to heat treatment for 16 hours at 180° C. in a clean oven under ambient atmosphere.

After that, the temperature was reduced to room temperature. A high-pressure nitrogen gas was sprayed near the ion implanted layer and then, the layer was mechanically delaminated from the sprayed portion while being torn from the single crystal silicon substrate (step (e)). At this time, an auxiliary substrate was attached to the single crystal silicon substrate and the quartz glass substrate from their rear side, and then delamination was performed. Further, the delaminated and transferred single crystal silicon layer 17 was subjected to heat treatment by flash lamp annealing under such conditions that the surface temperature is instantly increased to 700° C. or more, for recovery from hydrogen implantation damage.

On the surface of the single crystal silicon layer 17, a diffusion paste containing ethyl cellosolve containing phosphosilicate glass as a thickener was applied into 1-mm pitch patterns with the width of 50 μm by screen printing. The patterns were irradiated with light of flash lamp to instantly increase the surface temperature to 600° C. or more to thereby form a plurality of n-type diffusion regions 22 with a junction depth of about 0.2 μm (step (f)). As a result, the p-type regions 21 and n-type regions 22 were alternately formed on the surface of the single crystal silicon layer 17, and a plurality of pn junctions were formed in a planar direction.

This diffusion paste was cleaned with hydrofluoric acid and acetone, and isopropylalcohol, and removed. Then, silver as an electrode material was applied to form the first individual electrodes 23 on the plurality of p-type regions 21 and the second individual electrodes 24 on the plurality of n-type regions 22 by a vacuum evaporation or patterning method (step (g)).

After that, silver as an electrode material was applied to form first collecting electrodes 25 to connect the plurality of first individual electrodes 23 and form the second collecting electrodes 26 to connect the plurality of second individual electrodes 24 by vacuum evaporation with a metal mask (step (h)).

Next, a coating film made of silicon nitride was formed as the sealing layer 27 on all the surface but an extraction electrode, by reactive sputtering. Moreover, an aluminum film on which alumite treatment was performed as the light reflection film 28 was bonded onto the sealing layer 27 by use of polyvinylbutyral as an adhesive (step (i)).

In this way, the aluminum light reflection film 28, the silicon nitride sealing layer 27, the single crystal silicon layer 17, and the quartz glass substrate 12 as shown in FIGS. 2(a) and 2(b) were laminated. On the surface of the single crystal silicon layer 17 opposite to the surface on the quartz glass substrate 12 side, the plurality of p-type regions 21 and the plurality of n-type regions 22 were formed, and plurality of pn junctions were formed in at least a planar direction. The plurality of first individual electrodes 23 were formed on the plurality of p-type regions 21 of the single crystal silicon layer 17, and the plurality of second individual electrodes 24 were formed on the plurality of n-type regions 22. The first collecting electrodes 25 connecting the plurality of first individual electrodes 23 and the second collecting electrodes 26 connecting the plurality of second individual electrodes 24 were formed. Thus, the thin-film single crystal silicon solar cell 31 was completed.

The thus-manufactured single crystal silicon solar cell was irradiated with light from the light receiving surface 29 on the quartz glass substrate 12 side with a solar simulator at AM 1.5 and 100 mW/cm², to measure a conversion efficiency. The conversion efficiency was 13%, and no change with time was detected.

A high conversion efficiency was obtained although the light conversion layer is the thin-film single crystal silicon solar cell that is as thin as 3 μm. Such a high conversion efficiency could be attained because a silicon layer as the light conversion layer is single crystal silicon of high crystallinity, and an optical confinement type structure is employed.

EXAMPLE 2

A light scattering layer was formed on the light receiving surface 29 of the quartz glass substrate 12 of the single crystal silicon solar cell prepared in Example 1 as described below. That is, a polycondensation resin of alkyltrialkoxysilane and tetraalkoxysilane containing 60-wt % zirconium oxide particles having an average particle size of 0.3 μm and a refractive index of 2.4 and hydrolyzed and polycondensed with a hydrochloric acid as an catalyst was dissolved in a isopropylalcohol solvent to prepare a transparent resin material, and the resin material was applied with a thickness of 2 μm onto the quartz glass substrate 12.

Similar to Example 1, a conversion efficiency of the single crystal silicon solar cell where light scattering property is imparted to the surface of the quartz glass substrate 12 on the light receiving surface 29 side as described above was measured. As a result, the conversion efficiency was 16%, and no change with time was detected.

The conversion efficiency could be more improved than Example 1 because of improvements in the optical confinement type structure.

COMPARATIVE EXAMPLE

The formation stage of the silicon nitride sealing layer 2 in step (i) was completed in the same manner as that of Example 1. Next, a PET film was bonded onto the sealing layer 27 by use of polyvinylbutyral as an adhesive, in place of the aluminum film.

A conversion efficiency of the thus-manufactured single crystal silicon solar cell was measured similar to the above examples. As a result, the conversion efficiency was 11%.

As apparent from the above, the conversion efficiency is lower than Examples 1 and 2, and the optical confinement type structure of the present invention contributes to improvement in conversion efficiency of the thin-film single crystal silicon solar cell.

Incidentally, the present invention is not limited to the above embodiment. The above embodiment is illustrated for explanatory purposes, and any other components having substantially the same structure and advantages as those specified by the technical idea described in the scope of claims according to the present invention are included within the technical idea of the present invention.

The invention claimed is:

1. A method for manufacturing a single crystal silicon solar cell including at least a light reflection film, a single crystal silicon layer as a light conversion layer, and a transparent insulator substrate, which are laminated on one another with a surface on the transparent insulator substrate side used as a light receiving surface, comprising at least the steps of:
preparing the transparent insulator substrate and the single crystal silicon substrate having a first conductivity type;
implanting at least one of hydrogen ions and rare gas ions to the single crystal silicon substrate to form an ion implanted layer;
performing surface activation on at least one of an ion-implanted surface of the single crystal silicon substrate and one surface of the transparent insulator substrate;
bonding the ion-implanted surface of the single crystal silicon substrate and the transparent insulator substrate with the surface-activated surface being set as a bonding surface;
applying an impact to the ion implanted layer to mechanically delaminate the single crystal silicon substrate to form the single crystal silicon layer;
forming a plurality of diffusion regions having a second conductivity type different from the first conductivity type on the delaminated plane side of the single crystal silicon layer, and forming a plurality of pn junctions at least in a planar direction and forming a plurality of first conductivity type regions and a plurality of second conductivity type regions on the delaminated plane of the single crystal silicon layer;

forming a plurality of first individual electrodes on the plurality of first conductivity type regions of the single crystal silicon layer, and forming a plurality of second individual electrodes on the plurality of second conductivity type regions of the single crystal silicon layer;

forming first collecting electrodes connecting the plurality of first individual electrodes and second collecting electrodes connecting the plurality of second individual electrodes; and forming a light reflection film on a surface of the single crystal silicon substrate that is opposite to the ion-implanted surface of the single crystal silicon substrate that is bonded to the transparent insulator substrate.

2. The method for manufacturing a single crystal silicon solar cell according to claim 1, wherein the surface activation is performed through at least one of a plasma treatment and an ozone treatment.

3. The method for manufacturing a single crystal silicon solar cell according to claim 1, wherein the transparent insulator substrate is selected from the group consisting of quartz glass, crystallized glass, borosilicate glass, and soda-lime glass.

4. The method for manufacturing a single crystal silicon solar cell according to claim 2, wherein the transparent insulator substrate is selected from the group consisting of quartz glass, crystallized glass, borosilicate glass, and soda-lime glass.

5. The method for manufacturing a single crystal silicon solar cell according to claim 1, wherein an inner portion of the transparent insulator substrate or a surface of the transparent insulator substrate opposite to the surface to be bonded to the single crystal silicon substrate has light scattering property.

6. The method for manufacturing a single crystal silicon solar cell according to claim 2, wherein an inner portion of the transparent insulator substrate or a surface of the transparent insulator substrate opposite to the surface to be bonded to the single crystal silicon substrate has light scattering property.

7. The method for manufacturing a single crystal silicon solar cell according to claim 3, wherein an inner portion of the transparent insulator substrate or a surface of the transparent insulator substrate opposite to the surface to be bonded to the single crystal silicon substrate has light scattering property.

8. The method for manufacturing a single crystal silicon solar cell according to claim 4, wherein an inner portion of the transparent insulator substrate or a surface of the transparent insulator substrate opposite to the surface to be bonded to the single crystal silicon substrate has light scattering property.

9. The method for manufacturing a single crystal silicon solar cell according to claim 1, wherein a depth of the ion implantation is set to 2 μm or more and 50 μm or less from the ion-implanted surface.

10. The method for manufacturing a single crystal silicon solar cell according to claim 2, wherein a depth of the ion implantation is set to 2 μm or more and 50 μm or less from the ion-implanted surface.

11. The method for manufacturing a single crystal silicon solar cell according to claim 3, wherein a depth of the ion implantation is set to 2 .mu.m or more and 50 .mu.m or less from the ion-implanted surface.

12. The method for manufacturing a single crystal silicon solar cell according to claim 4, wherein a depth of the ion implantation is set to 2 μm or more and 50 μm or less from the ion-implanted surface.

13. The method for manufacturing a single crystal silicon solar cell according to claim 5, wherein a depth of the ion implantation is set to 2 μm or more and 50 μm or less from the ion-implanted surface.

14. The method for manufacturing a single crystal silicon solar cell according to claim 6, wherein a depth of the ion implantation is set to 2 μm or more and 50 μm or less from the ion-implanted surface.

15. The method for manufacturing a single crystal silicon solar cell according to claim 7, wherein a depth of the ion implantation is set to 2 μm or more and 50 μm or less from the ion-implanted surface.

16. The method for manufacturing a single crystal silicon solar cell according to claim 8, wherein a depth of the ion implantation is set to 2 μm or more and 50 μm or less from the ion-implanted surface.

17. The method for manufacturing a single crystal silicon solar cell according to claim 1, wherein if the light reflection film is formed of metal, a transparent sealing layer is formed after forming the first collecting electrodes and the second collecting electrodes and before forming the light reflection film, the transparent sealing layer burying the electrodes formed on the single crystal silicon layer.

18. The method for manufacturing a single crystal silicon solar cell according to claim 1, wherein if the light reflection film is formed of an insulator material, the light reflection film is formed to bury the electrodes formed on the single crystal silicon layer.

* * * * *